(12) United States Patent
Washburn

(10) Patent No.: US 7,659,732 B2
(45) Date of Patent: Feb. 9, 2010

(54) FOUR-WIRE OHMMETER CONNECTOR AND OHMMETER USING SAME

(75) Inventor: Monte Washburn, Stanwood, WA (US)

(73) Assignee: Fluke Corporation, Everett, WA (US)

( * ) Notice: Subject to any disclaimer, the term of this patent is extended or adjusted under 35 U.S.C. 154(b) by 272 days.

(21) Appl. No.: 11/818,632

(22) Filed: Jun. 15, 2007

(65) Prior Publication Data

US 2008/0311796 A1    Dec. 18, 2008

(51) Int. Cl.
*G01R 27/08*    (2006.01)
*G01R 31/08*    (2006.01)

(52) U.S. Cl. ............... 324/715; 324/525; 324/691
(58) Field of Classification Search ........... 324/715, 324/525, 691
See application file for complete search history.

(56) References Cited

U.S. PATENT DOCUMENTS 2,839,723 A * 6/1958 De Armond ............ 324/555
4,829,235 A * 5/1989 Robinson et al. ............ 324/502
5,508,621 A    4/1996 Wong ......................... 324/549
6,045,389 A    4/2000 Ferrill et al. ................. 439/398
6,384,614 B1  5/2002 Hager et al. ................. 324/754
7,064,564 B2 * 6/2006 Kister et al. ................. 324/715

FOREIGN PATENT DOCUMENTS

GB            578576        7/1946

* cited by examiner

*Primary Examiner*—Amy He
(74) *Attorney, Agent, or Firm*—Dorsey & Whitney LLP

(57) ABSTRACT

A four-wire ohmmeter connector includes a pair of elongated members spaced apart from each other by an interconnecting web. A pair of elongated contacts are mounted on forwardly projecting portions of each of the elongated members. An insulative housing surrounds the elongated members, contacts and web. The contacts mounted on one of the elongated members are connected through separate wires to a positive probe, and the contacts mounted on the other of the elongated members are connected through separate wires to a negative probe. The elongated members are inserted into respective terminal apertures of a four-wire ohmmeter. A pair of semi-cylindrical conductive sleeves are aligned with each of the apertures, and they make contact with and compress the respective contacts that are inserted into the aperture.

7 Claims, 5 Drawing Sheets

FOUR-WIRE OHMMETER CONNECTOR AND OHMMETER USING SAME

TECHNICAL FIELD

This invention relates to test and measurement equipment, and more specifically to a connector for a four-terminal resistance measurement device.

BACKGROUND OF THE INVENTION

Test and measurement instruments, such a volt/ohmmeters, have been in common use for many years. Conventional volt/ohmmeters include a pair of test terminals, designated positive ("+") and negative ("−"), that are connected to test points through respective wires or "leads." Each lead generally has a respective plug at one end that plugs into one of the test terminals of the volt/ohmmeter, and a test probe, alligator clip, or other structure that is adapted to make electrical contact with a test point.

For AC or DC voltage measurements, the leads are connected to respective test points, and the voltage between the test points is measured by the instrument. For resistance measurements, the volt/ohmmeter passes a current between the two leads, and the voltage between the two leads is measured. The resistance in ohms is then determined as the ratio of voltage-to-current. In practice, the resistance is measured simply by measuring the voltage since the current is generally constant. The measured voltage, or, more correctly, the measured voltage calibrated in resistance, can then be read by a user on an analog pointer-type meter or on a digital display.

Conventional two-wire volt/ohmmeters are very satisfactory in most applications. However, under some circumstances, they do not provide sufficiently accurate resistance measurements. For example, when the resistance to be measured is very low, the resistance of the leads in relation to the resistance to be measured can be unacceptably large. Under these circumstances, a significant portion of the voltage between the leads as measured by the instrument can result from voltage drops in the leads rather than across the resistance to be measured. The instrument will then provide an erroneous resistance measurement. For example, assume that the resistance to be measured is actually 0.5 ohms, and each lead has a resistance of 0.2 ohms. If the volt/ohmmeter supplies a current through the leads of 100 mA (i.e., 0.1 amp), the voltage between the two leads as measured by the instrument would be 0.09 volts (i.e., 0.1*0.9). The instrument would then calculate the resistance to be measured at 0.9 ohms (i.e., 0.09/0.1) when, in fact the resistance to be measured is really 0.5 ohms.

To alleviate this problem, four-wire ohmmeters have been developed. In a four-wire ohmmeter, each of two test points is connected to the instrument through two separate leads. One of the leads in each pair carries the current to or from the resistance to be measured, and the other lead in the pair measures the voltage on one side of the resistance to be measured. Any voltage drop in the lead carrying the current is not reflected in the reading since the voltage-measuring lead measures the voltage at the resistance to be measured rather than at the junction between the instrument and the current-carrying lead. And since the input impedance of the resistance measuring circuit is generally very high, very little current is carried by the voltage-measuring lead, thus making any voltage drop across the lead nominal. An example of a four-wire ohmmeter is described in U.S. Pat. No. 5,508,621 to Wong, which is incorporated herein by reference.

Insofar as four-wire ohmmeters have four separate leads, the ohmmeter itself must have four test terminals. These test terminals are commonly known as the high ("HI") terminal, the Sense HI terminal, which is connected to the same test point as the HI terminal, the low ("LO") terminal, and the Sense LO terminal, which is connected to the LO terminal. The HI terminal is generally connected to a current source, and the LO terminal is generally connected to a corresponding current sink. The Sense HI terminal is connected to the positive input of a voltage measuring device, and the Sense LO terminal is connected to the negative input of the voltage measuring device. These test terminals have typically been in the form of cylindrical apertures or "jacks" that are adapted to receive respective "banana plug" connectors. Thus four banana plug jacks have typically been required in a four-wire ohmmeter.

One approach to reducing the number of jacks in a four-wire ohmmeter is described in the previously mentioned patent to Wong. The ohmmeter described in the Wong patent uses two banana plugs physically connected to each other through an insulator. Each of the banana plugs has two axially spaced contacts, which are connected to respective leads. The two-contact banana plugs are inserted into respective jacks in the ohmmeter, and each jack includes a pair of axially spaced contacts that mate with respective contacts of the banana plug.

The connector shown in the Wong patent has the advantage of reducing the number of jacks required by the ohmmeter, and it is also structured to be compatible with conventional two-wire leads, albeit without the benefit of a four-wire measurement. Although this connector represents a significant improvement in the art, it is nevertheless less than ideal in some situations. For example, insofar as the contacts of the banana plug are exposed, their contact surfaces can more easily become contaminated, which may undesirably increase their connection resistance. Also, it is possible for the connector shown in the Wong patent to make incorrect connections to the ohmmeter. For example, if the banana plugs are not inserted a sufficient distance into their respective jacks, the end contact of the banana plug may bridge the inner and outer contacts of the jack. In such case, the ohmmeter would provide a resistance measurement, but it would not be apparent that the measurement being made is essentially using only two rather than four wires.

There is therefore a need for an improved connector for use with a four-wire ohmmeter.

SUMMARY OF THE INVENTION

A four-wire test connector includes first and second, electrically insulative elongated members separated from each other a predetermined distance by an interconnecting web. A pair of elongated electrical contacts are mounted on opposite surfaces of each of the elongated members and are spaced apart from each other so they are electrically isolated from each other. The elongated members and interconnecting web are preferably surrounded by a housing, which may include an insulative cylindrical member co-axially surrounding each of the elongated members. The contacts are preferably formed of a resilient material, and they bow outwardly at their midsections. The contacts mounted on one of the elongated members are preferably connected through first and second conductive wires to a positive probe, and the contacts mounted on the other of the elongated members are preferably connected through third and fourth conductive wires to a negative probe. In use, the elongated members are preferably inserted into respective terminal apertures of a four-wire ohmmeter, and the contacts on each elongated member are compressed by a pair of semi-cylindrical conductive sleeves, which connect the contacts to internal circuitry in the ohmmeter.

DETAILED DESCRIPTION

Figure 1:
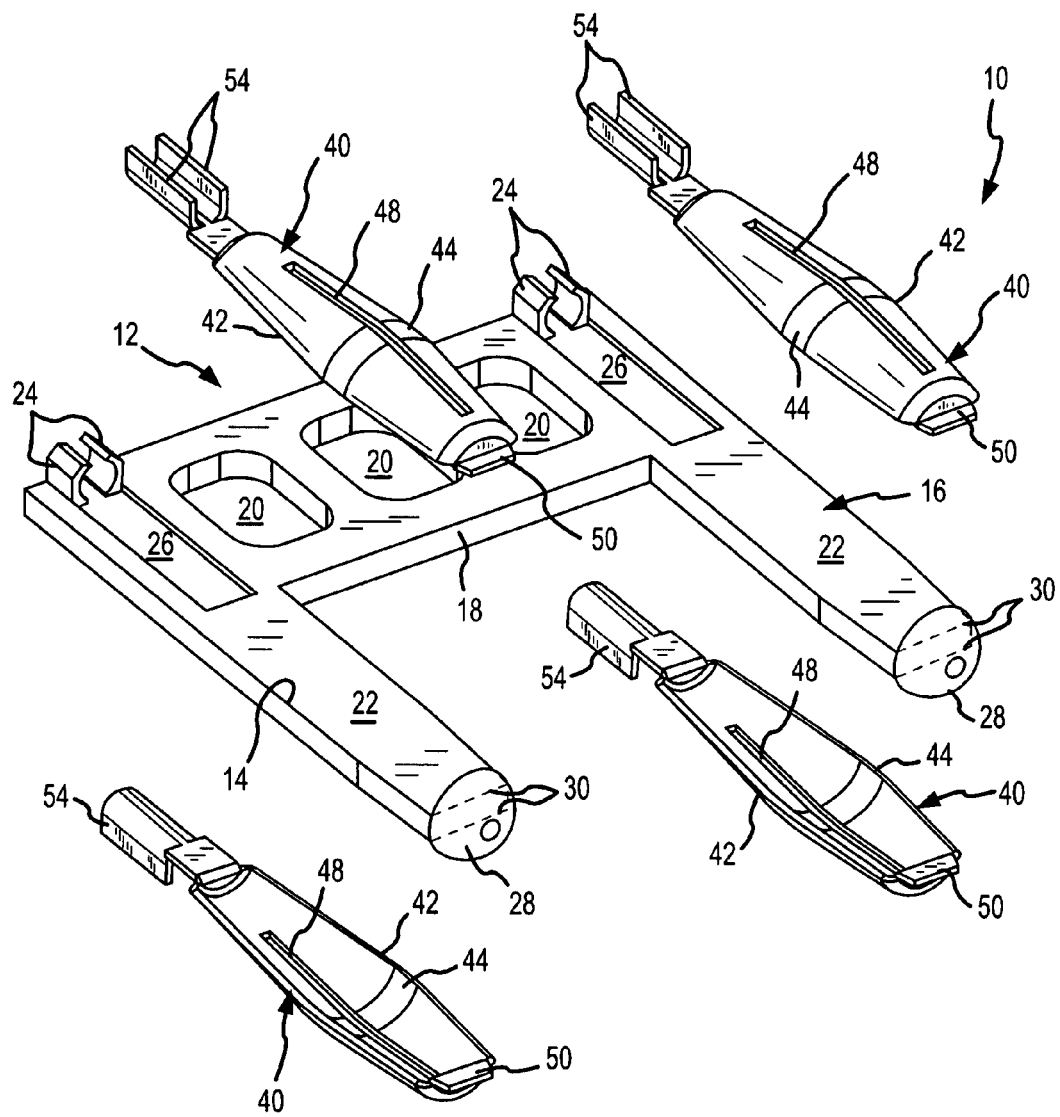
FIG. 1 is an exploded isometric view of a four-wire ohmmeter connector according to one example of the invention.
Figure 2:
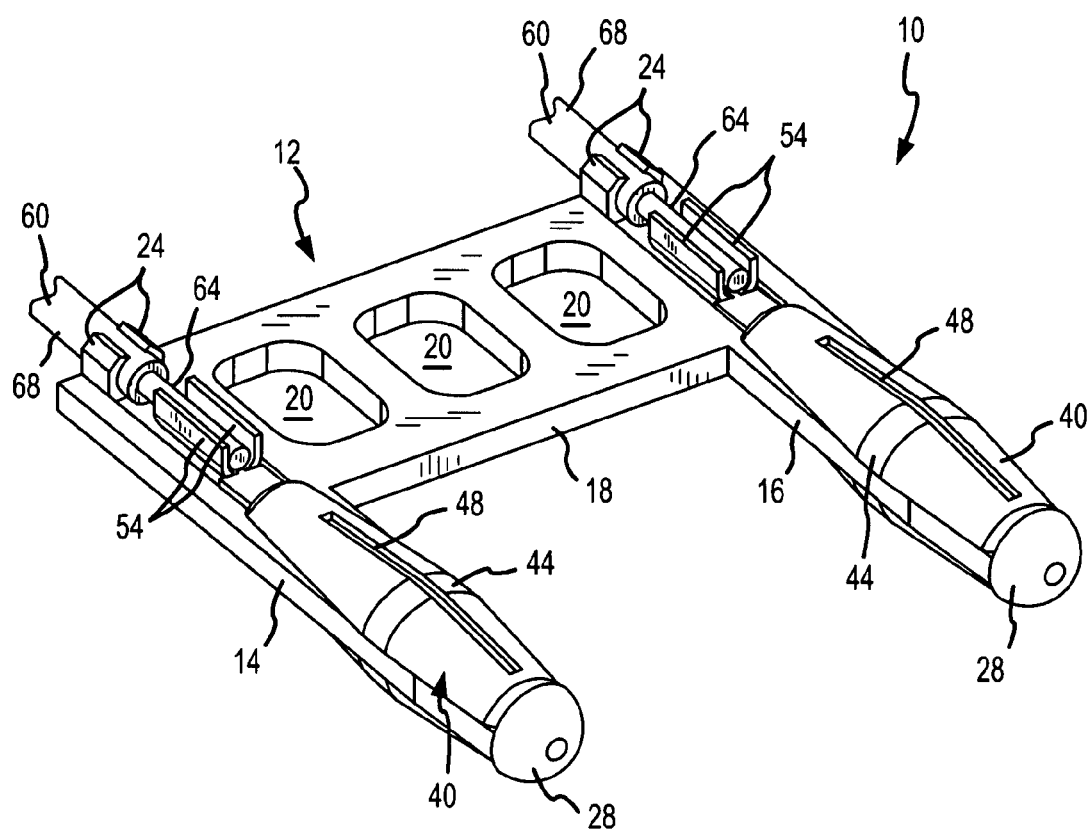
FIG. 2 is a partially-assembled isometric view of the four-wire ohmmeter connector of FIG. 1.
Figure 3:
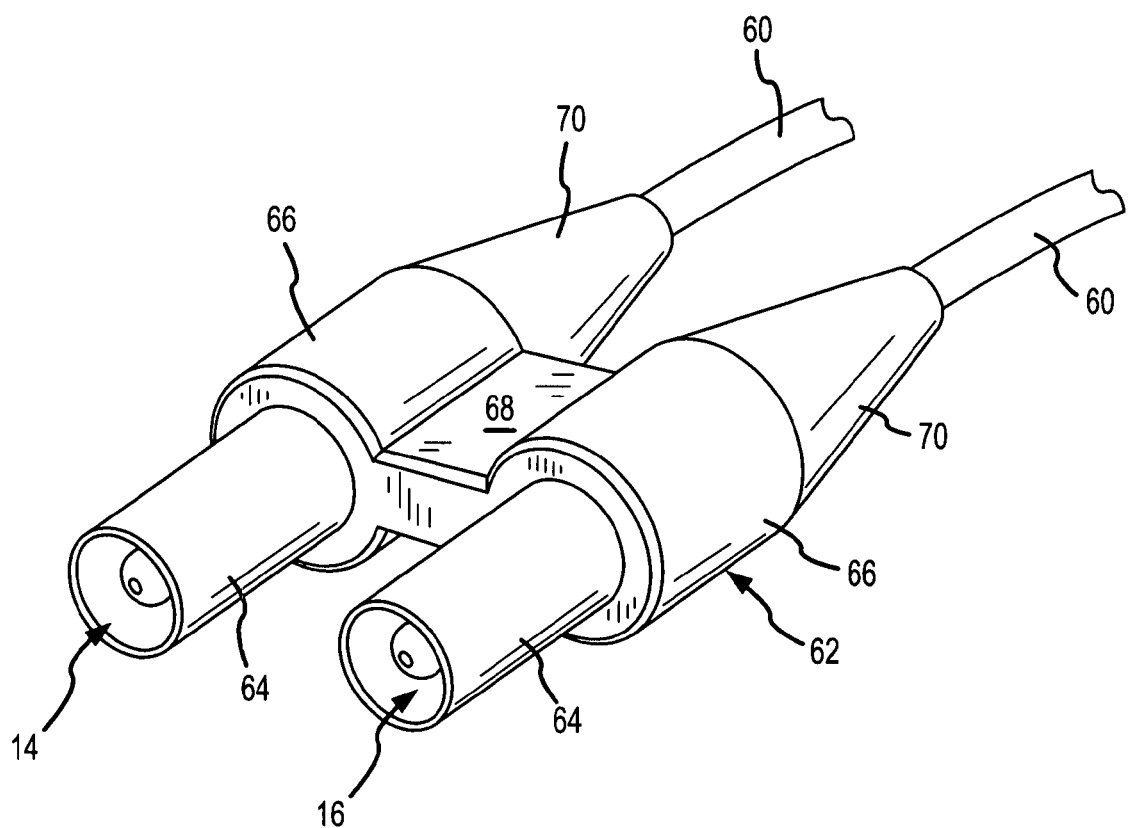
FIG. 3 is a fully-assembled isometric view of the four-wire ohmmeter connector of FIGS. 1 and 2.

FIGS. 1-3 show one example of a four-wire ohmmeter connector 10. With reference to FIG. 1, the connector 10 includes a frame 12 formed with two elongated members 14, 16 interconnected by a web 18 at one end so that the elongated members 14, 16 are spaced apart from each other by a predetermined distance and project forwardly from the web 18. In one example of the frame 12, the centerlines of the elongated members 14, 16 are spaced-apart from each other by 0.75 inches. The frame 12 is fabricated of a suitable material, such as plastic. The material forming at least the elongated members 14, 16 should also be electrically insulating. The web 18 is preferably but not necessarily formed with a series of apertures 20, which reduce the weight of the frame 12 and the amount of material required to form the frame 12 without unduly decreasing the strength of the frame 12. Each of the elongated members 14, 16 has generally flat upper and lower surfaces 22 on which spaced-apart clamping members 24 and a rectangular recess 26 are formed for reasons that will be explained below. The clamping members 24 and rectangular recesses 26 are formed on both the upper surfaces of the elongated members 14, 16 (as shown in FIGS. 1 and 2), and the lower surfaces of the elongated members 14, 16 (which are not shown in FIGS. 1 and 2). Finally, a partially spherical member 28 is formed at the forwardly-projecting end of each of the elongated members 14, 16. Although not shown in FIG. 1, a pair of slots 30 are formed along the rear surface of each of the partially spherical members 28, which are substantially aligned with the flat upper and lower surfaces 22, respectively.

Each of the elongated members 14, 16 carry a pair of contacts 40 on their upper and lower surfaces. The contacts 40 each include a somewhat cylindrical portion 42 having a diameter that increases from each end toward its midsection where a constant diameter portion 44 is formed. As a result, the contacts 40 bow outwardly at their midsections. The contacts 40 are preferably formed of a suitable material, such as tellurium copper or gold plated beryllium copper, to provide good resiliency and conductivity. However, in some embodiments, the contacts 40 need not be resilient. An elongated slot 48 is formed in each cylindrical portion 42 so that the cylindrical portion 42 can be compressed, as explained in greater detail below. A tab 50 projects from the end of each contact 40. The tab 50 fits into the slot 30 formed in the partially spherical member 28 to secure the contacts 40 to the frame 12, as shown in FIG. 2. A pair of crimping members 54 are formed in each contact 40 at the end opposite the tab 50. In the example of the connector 10 shown in FIG. 1, the contacts 40 are positioned on symmetrically opposite sides of the web 18, i.e., the tops and bottoms of the elongated members 14, 16. However, it should be understood that the contacts 40 could have a different orientation, but a different orientation may be less desirable because it could limit the lengths of the elongated members 14, 16 and/or make it more difficult to connect the contacts 40 to respective wires, as described below.

With further reference to FIG. 2, when the contacts 40 are secured to the frame 12, the crimping members 54 fit into the rectangular recesses 26 (FIG. 1) formed on the flat surfaces 22, and the crimping members 54 are aligned with the clamping members 24. A respective wire 60 has a conductor 64 crimped between the crimping members 24 of each contact 40, and an insulative coating 68 held by the clamping members 24. The clamping of the insulative coating 68 by the clamping members 24 and the crimping of the conductor 64 by the crimping members 24 has the effect of securing the rear portion of each conductor 40 to the frame 12.

After the contacts 40 have been secured to the frame 12 and the wires 60 have been secured as sown in FIG. 2, a housing 62 is secured around the frame 12 and contacts 40 as shown in FIG. 3. The housing 62 is formed by any suitable material, such as plastic. The housing 62 includes a pair of cylindrical portions 64 that surround the forwardly extending portions of the elongated members 14, 16, including the contacts 40. The cylindrical portions 64 perform the function of electrically isolating the contacts 40 from the external environment so the surfaces of the contacts 40 do not become contaminated, which might unduly increase their surface resistance. The housing 62 also includes a pair of cylindrical portions 66 having a diameter larger than the portions 64, which are interconnected by a intermediate portion 68 that surrounds the web 18 of the frame 12. Finally, a pair of conical portions 70 project rearwardly to an opening through which respective ones of the wires 60 extend.

Figure 4:
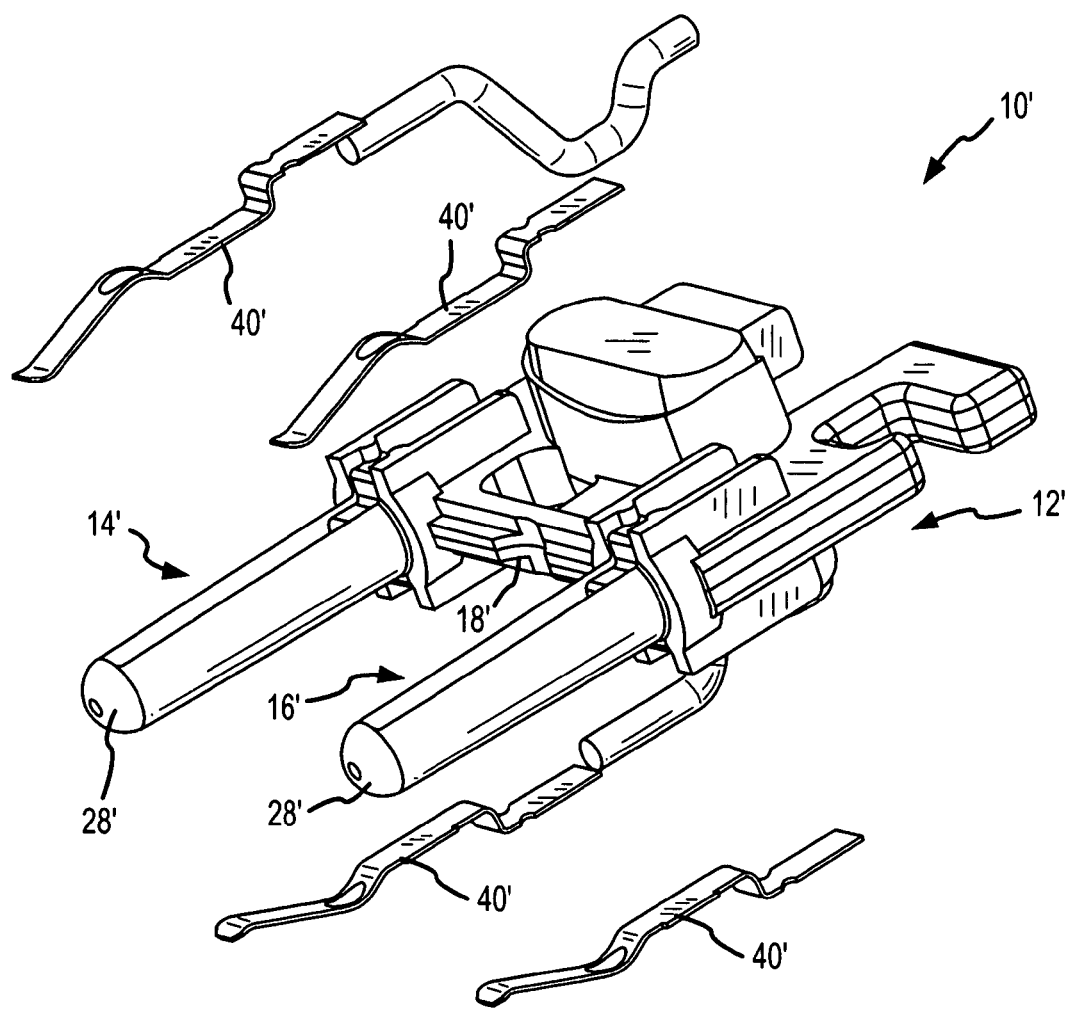
FIG. 4 is an exploded isometric view of a four-wire ohmmeter connector according to another example of the invention.

FIG. 4 shows another example of a four-wire ohmmeter connector 10'. The connector 10' includes substantially the same components that are used in the connector 10 shown in FIGS. 1-3. Therefore, in the interest of brevity, the components have been provided with corresponding reference numbers, and a description of their structure and operation will not be repeated. The connector 10' differs from the connector 10 shown in FIGS. 1-3 primarily in the shape of its components. For example, the frame 12' is thicker than the frame 12 used in the connector 10, the elongated members 14', 16' are more cylindrical than the elongated members 14, 16 used in the connector 10, and the contacts 40' are substantially thinner and shaped differently compared to the contacts 40 used in the connector 10.

Figure 5:
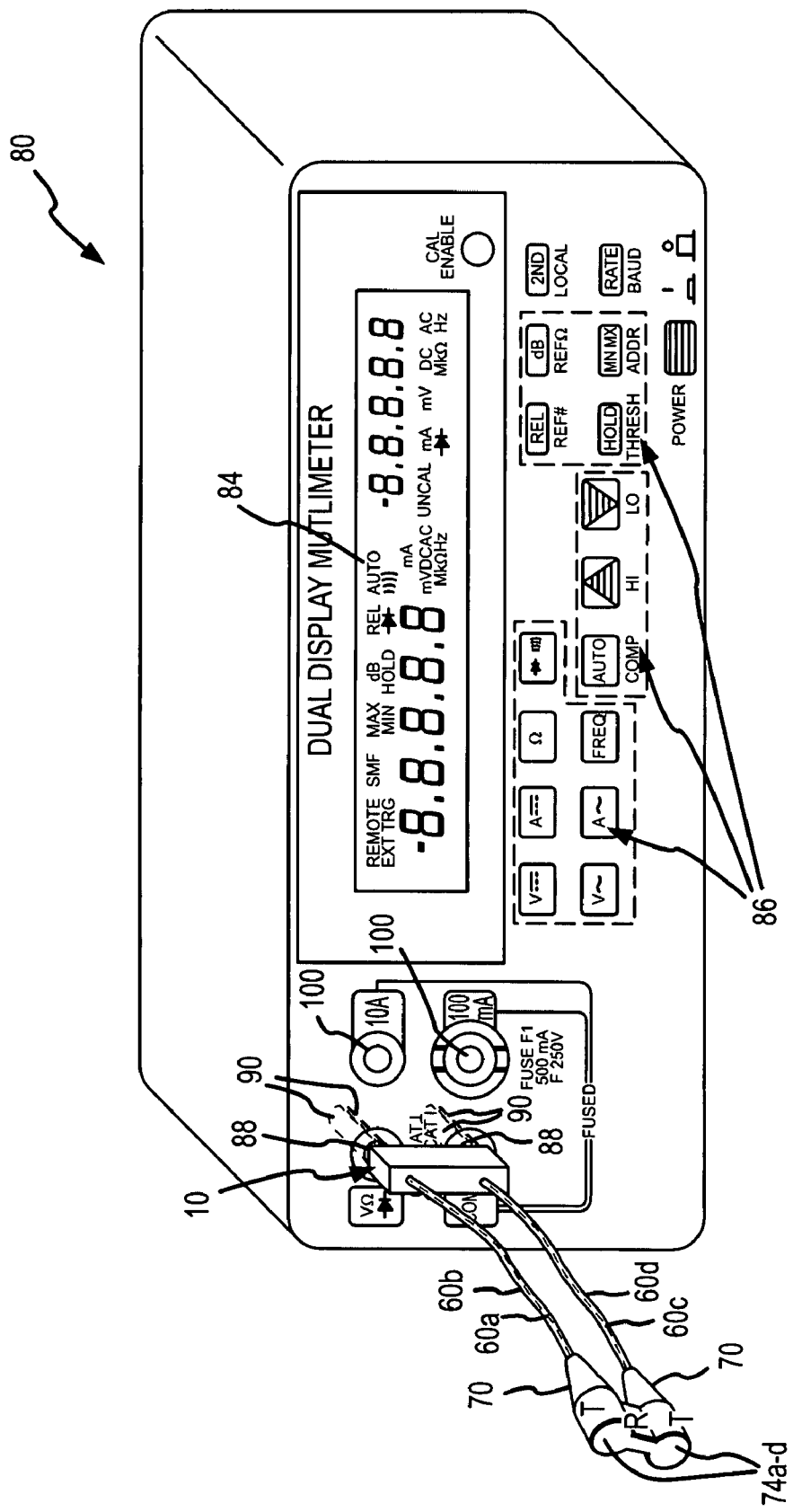
FIG. 5 is an isometric view of a four-wire ohmmeter being used to measure resistance through 4 wires, which are connected to the ohmmeter using the connector of FIGS. 1-3.

The four-wire ohmmeter connector 10 or 10' is shown in use with an ohmmeter 80 of conventional design in FIG. 5. The ohmmeter 80 includes a digital display 84, manually operable controls 86, and a pair of apertures 88. The connector 10 is plugged into the apertures 88 of the ohmmeter 80, and two wires 60a,b and 60c,d extend from the opening formed at the end of the respective conical portions 70. As shown in FIG. 5, the wires 60a,b are in the form of a first coaxial cable, and the wires 60c,d are in the form of a second coaxial cable. However, separate wires or other wire configurations may be used. The wires 60a,b are connected to a positive voltage probe 74a, and the wires 60c,d are connected to a positive current probe 74b. The probes 74a, b are placed in electrical contact with terminals T of a resistance R to be measured. The probes 74a-d may be of conventional design, such as alligator clips, needle probes, clip-on probes, and banana plugs, to name a few. The probes 74*a-d* are marked with suitable designations and/or color coding identifying their polarity as being either positive or negative. Alternatively, the two wires 60*a,b* used to sense positive voltage and current may be connected to separate probes, and the two wires 60*c,d* used to sense negative voltage and current may be connected to separate probes.

The connector 10 is plugged into the ohmmeter 80 by inserting each of the cylindrical portions 64 into a respective one of the apertures 88. Aligned with each of the apertures 88 is a pair of electrically conductive, semi-circular sleeves 90, which are electrically isolated from each other. The outside diameter of the sleeves 90 is small enough to fit within the cylindrical portions 64, and the inside diameter of the sleeves 90 is selected to surround the contacts 40 in a slightly compressed condition. However, in some embodiments of the connector 10 in which the contacts 40 are not be resilient, the sleeves 90 may be resiliently biased inwardly to maintain contact with the contacts 40. When each of the cylindrical portions 64 has been inserted through a respective one of the apertures 88, one of the contacts 40 mounted on a respective one of the elongated members 14, 16, makes contact with one of the semicircular sleeves 90, and the other contact mounted on the same elongated member 14, 16 makes contact with the other semicircular sleeve 90. Therefore, in the event the contacts 40 have an angular orientation in which they are not symmetrically positioned relative to the web 18, the angular orientation of the sleeves 90 would be altered so that each contact 40 makes electrical contact with one and only one sleeve 90. Insofar as the contacts 40 can touch the respective sleeves 90 over a considerable distance along the lengths of the sleeves, the proper connections between the probes and the ohmmeter 80 of the cylindrical portions 64 are not inserted all of the way into the respective apertures 88.

Although, the sleeves 90 may be connected to internal circuitry 100 in the ohmmeter 80 in a variety of ways, the sleeves 90 are preferably connected through the respective wires 60 to probes contacting the same terminal T of the resistance R to be measured. In other words, one sleeve 90 aligned with one aperture 88 is preferably connected to the positive voltage probe 74*a* while the other sleeve 90 aligned with the same aperture 88 is preferably connected to the positive current probe 74*b*. Similarly, one sleeve 90 aligned with the other aperture 88 is preferably connected to the negative voltage probe 74*c* while the other sleeve 90 aligned with the same aperture 88 is preferably connected to the negative current probe 74*d*. Connecting the sleeve 90 to the internal circuitry 100 in this manner allows the connector to be fully "backward compatible." Specifically, the four-wire ohmmeter 80 can accept a suitably sized two-wire connector (not shown) and still provide accurate resistance measurements since each wire will connect to the sleeves 88 having the same voltage and current polarity. In fact, the four-wire connector 10 can be used as a two-wire connector by accepting two wires (not shown), each of which is connected to either one or both of the contacts 40 mounted on a respective one of the elongated members 14, 16. Also, the connector 10 may be inserted into suitably sized apertures of conventional two-wire ohmmeters (not shown), and the correct resistance measurement will be obtained when the probes are connected in the same manner as with a four-wire resistance measurement.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

I claim:

1. A system for measuring the resistance between first and second terminals of a resistive device, the system comprising:
    a four-wire ohmmeter, comprising:
        a housing;
        a display mounted in the housing and being visible externally from the housing;
        electrical circuitry mounted within the housing and connected to the display, the electrical circuitry including a current source, a current sink, and a voltage measuring device having a positive terminal and a negative terminal; and
        first and second apertures formed in the housing, each of the terminal apertures having a pair of semi-cylindrical conductive sleeves aligned with the respective aperture and electrically isolated from each other, the sleeves being connected to the electrical circuitry;
    a positive probe and a negative probe;
    first and second conductive wires connected to the positive probe;
    third and fourth conductive wires connected to the negative probe; and
    a four-wire connector, comprising:
        a first and second, electrically insulative elongated members separated from each other by a predetermined distance by an interconnecting web;
        a pair of elongated electrical contacts mounted on opposite surfaces of each of the elongated members, the contacts mounted on each of the elongated members being spaced apart from each other, the contacts mounted on one of the elongated members being connected to the first and second wires, respectively, and the contacts mounted on the other of the elongated members being connected to the third and fourth wires, respectively, the contacts that are connected to the first and second conductive wires being sized and shaped to fit into the sleeves that are aligned with the first aperture of the ohmmeter and to make contact with respective ones of the sleeves that are aligned with the first aperture, the contacts that are connected to the third and fourth conductive wires being sized and shaped to fit into the sleeves that are aligned with the second aperture of the ohmmeter and to make contact with respective ones of the sleeves that are aligned with the second aperture.

2. The resistance measuring system of claim 1, further comprising a housing surrounding the elongated members and interconnecting web, the housing including an insulative cylindrical member surrounding and co-axial with each of the elongated members.

3. The resistance measuring system of claim 1 wherein the elongated members project longitudinally from the web and each terminate in an enlarged portion in which a pair of slots are formed on opposite surfaces of the elongated member, and wherein a respective tab projects from one end of each of the contacts and is received by a respective one of the slots to secure the contacts to the elongated members.

4. The resistance measuring system of claim 1 wherein the contacts are formed of a resilient material and the contacts bow outwardly toward their midsections.

5. The resistance measuring system of claim 1 wherein a pair of crimping members are formed at one end of each of the contacts.

6. The resistance measuring system of claim 5 wherein an elongated slot is formed in each contact to facilitate resilient compression of the contact.

7. The resistance measuring system of claim 1 wherein one of the sleeves aligned with the first aperture is connected to the current source, the other of the sleeves aligned with the first aperture is connected to the positive terminal of the voltage measuring device, one of the sleeves aligned with the second aperture is connected to the current sink, and the other of the sleeves aligned with the second aperture is connected to the negative terminal of the voltage measuring device.

* * * * *